US010527670B2

(12) United States Patent
Refai-Ahmed et al.

(10) Patent No.: US 10,527,670 B2
(45) Date of Patent: Jan. 7, 2020

(54) TESTING SYSTEM FOR LID-LESS INTEGRATED CIRCUIT PACKAGES

(71) Applicant: Xilinx, Inc., San Jose, CA (US)

(72) Inventors: Gamal Refai-Ahmed, Santa Clara, CA (US); Ivor G. Barber, Los Gatos, CA (US); Suresh Ramalingam, Fremont, CA (US); Jaspreet Singh Gandhi, San Jose, CA (US); Tien-Yu Lee, San Jose, CA (US); Henley Liu, San Jose, CA (US); David M. Mahoney, Gilroy, CA (US); Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 382 days.

(21) Appl. No.: 15/471,390

(22) Filed: Mar. 28, 2017

(65) Prior Publication Data
US 2018/0284187 A1 Oct. 4, 2018

(51) Int. Cl.
*G01R 31/28* (2006.01)
(52) U.S. Cl.
CPC ..... *G01R 31/2891* (2013.01); *G01R 31/2889* (2013.01)

(58) Field of Classification Search
CPC ............... G01R 1/067; G01R 1/06716; G01R 1/06722; G01R 1/07307; G01R 1/07314
See application file for complete search history.

(56) References Cited

U.S. PATENT DOCUMENTS

| 2007/0099447 | A1* | 5/2007 | Hayashi | ............. | G01R 31/2893 439/73 |
| 2008/0211486 | A1* | 9/2008 | Moriyama | ............. | G01K 1/026 324/757.04 |
| 2010/0164525 | A1* | 7/2010 | Han | ..................... | G01R 1/0458 324/756.02 |

* cited by examiner

*Primary Examiner* — Tung X Nguyen
(74) *Attorney, Agent, or Firm* — Patterson + Sheridan, LLP

(57) ABSTRACT

Integrated (IC) package testing systems and methods for testing an IC package are provided herein that accommodate IC packages having different die heights. In one example, the IC package testing system includes a test fixture base, a socket, and a test fixture head. The socket is disposed on the test fixture base and configured to receive an IC package for testing. The test fixture head is movable towards and away from the base. The test fixture head includes a base plate and a plurality of independently movable pushers. The plurality of pushers are configured to engage the IC package disposed the socket.

20 Claims, 7 Drawing Sheets

TESTING SYSTEM FOR LID-LESS INTEGRATED CIRCUIT PACKAGES

TECHNICAL FIELD

Embodiments of the present invention generally relate to a testing system suitable for testing integrated circuit packages.

BACKGROUND

Electronic devices, such as tablets, computers, copiers, digital cameras, smart phones, control systems and automated teller machines, among others, often employ electronic components which leverage chip (integrated circuit) packages for increased functionality and higher component density. IC packages generally include two or more integrated circuit dice that are mounted on a common substrate, such as an interposer or substrate package, which is mounted in use to a printed circuit board. As IC packages become larger and more complex, testing of the IC packages becomes more time consuming and difficult, which undesirable increases the unit manufacturing cost. Moreover, IC packages that do not have lids are susceptible to damage during testing as conventional testing equipment cannot adequately accommodate differences in the height of the dice. Simply making custom high tolerance and more sophisticated testing equipment is not a desirable solution due to the high capital costs for specialized equipment that is limited for use with a specific package configuration.

Therefore, a need exists for an improved testing system.

SUMMARY

Integrated (IC) package testing systems and methods for testing an IC package are described herein that accommodate IC packages having different die heights. Advantageously, the IC package testing systems described herein facilitate testing packages having multiple dies (such as partitioned field programmable gate arrays (FPGAs), high bandwidth memory (HBM) dies) among others) using a conformable test fixture head surface as compared to conventional IC package testing systems which have a ridge, inflexible test fixture head surface for contacting dies which generally applies unwanted and potentially damaging stress to the package.

In one example, the IC package testing system includes a test fixture base, a socket, and a test fixture head. The socket is disposed on the test fixture base and configured to receive an IC package for testing. The test fixture head is movable towards and away from the base. The test fixture head includes a base plate and a plurality of independently movable pushers. The plurality of pushers are configured to engage the IC package disposed the socket.

In another example, an IC package testing system includes a test fixture base, a socket, and a test fixture head. The socket is disposed on the test fixture base and configured to receive an IC package for testing. The test fixture head is movable towards and away from the base. The test fixture head includes a base plate, sidewalls extending from the base plate, a plurality of independently movable pushers coupled to a bottom of the base plate and surrounded by the sidewalls, a plurality of force generating members, and a plurality of guides. Each of the force generating members are disposed between a respective one of the pushers and the base plate. The plurality of pushers and the plurality of force generating members are fabricated from a material having high thermal conductivity. The plurality of guides are coupled to the base plate and are disposed between the plurality of pushers.

In yet another example, a method for testing an IC package is provided. The method includes disposing an IC package in a socket of an IC package test station, engaging two or more dice of the IC package with independently movable pushers while urging the IC package into electric connection with the socket, and performing a test routine on the IC package disposed in the IC package test station.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Integrated circuit (IC) package testing systems and methods for testing IC packages are disclosed herein that improve testing of lid-less IC packages with significantly reduced risk of damage as compared to conventional test systems. Moreover, the IC package testing systems are configured to apply different amounts of force to discreet locations of the IC package so that good electrical connection may be established between the IC package and the test systems without adversely stressing the IC package. Furthermore, the force applicator of the IC package testing systems is flexible in that it will accommodate IC packages having different geometric configurations, thereby enabling changing production demands to be met with limited additional capital expenditures or down time for system reconfiguration.

Exemplary IC packages generally include at least two or more integrated circuit (IC) dice disposed on a substrate. The substrate may be a package substrate or an interposer mounted to a package substrate. The IC die may be a programmable logic device, such as field programmable gate arrays (FPGA), a memory device, an optical device, a MEMS device, a processor or other IC logic or memory structure. Optical devices include photo-detectors, lasers, optical sources, and the like. The functionality of the IC die is provided by solid state circuitry formed in the die. At the end of the IC package fabrication process, the IC packages are tested to ensure robust and predictable performance.

Figure 1:
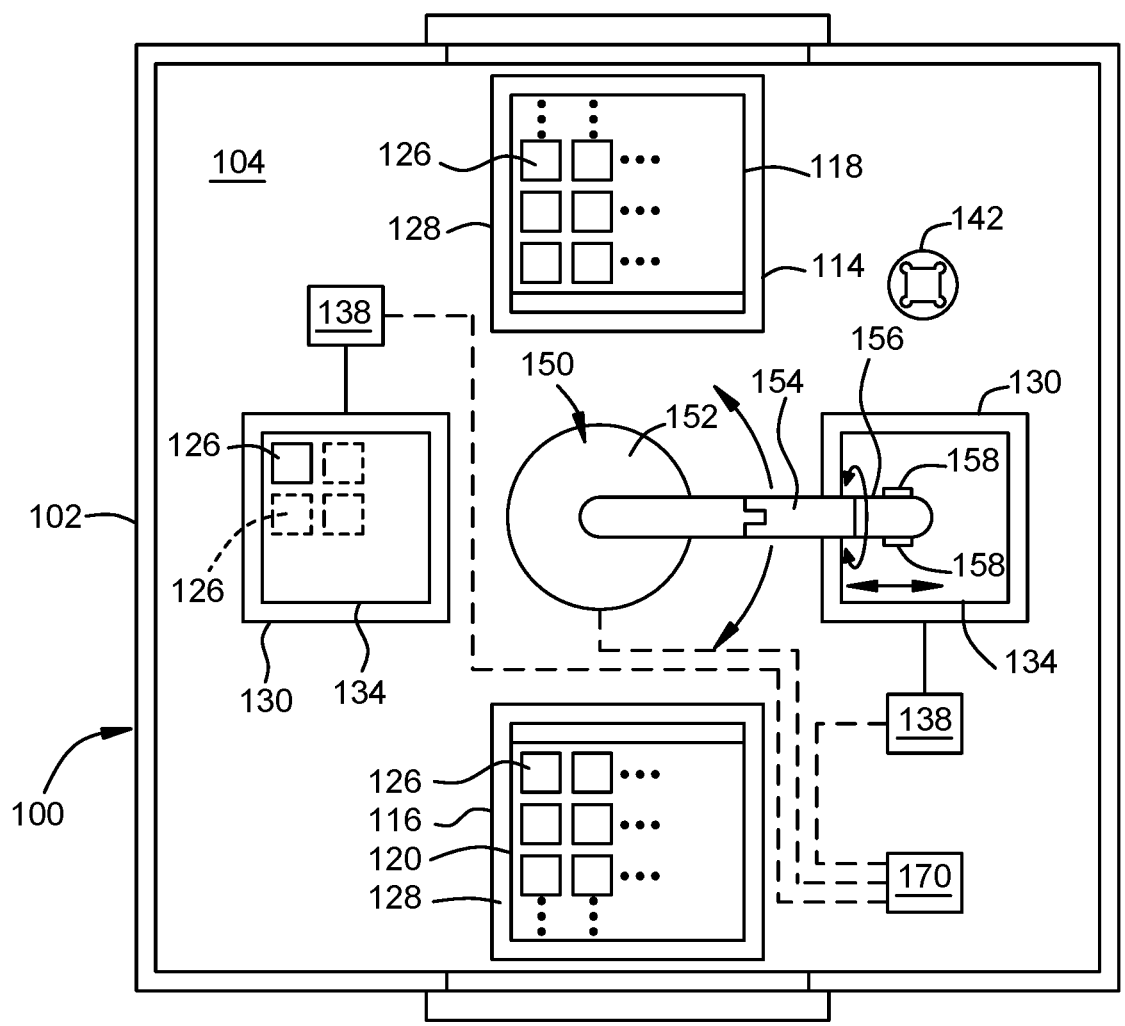
FIG. 1 is a schematic top view of an IC package testing system.

FIG. 1 is a schematic top view of an IC package testing system 100 suitable for testing IC packages 126. The IC package testing system 100 generally includes an enclosure 102 having in interior region 104. At least an input station 114, at least one or more of test stations 130, an output station 116, and a robot 150 are disposed in the interior region 104 of the enclosure 102. The robot 150 has a range of motion operable to transfer an IC package 126 between any of the input, output and test stations 114, 116, 130 of the testing system 100.

The IC package testing system 100 also includes a controller 170 that is utilized to control the operation of the IC package testing system 100, including the operation of the robot 150 and the test station 130. The controller 170 generally includes a central processing unit (CPU), memory, and support circuits utilized to control the operation of the IC package testing system 100. The CPU may be any form of general purpose computer processor that may be used in an industrial setting. A software routine or a series of program instructions are stored in the memory, such as random access memory, read only memory, floppy, or hard disk drive, or other form of digital storage. The support circuit is conventionally coupled to the CPU and may include cache, clock circuits, input/output systems, power supplies, and the like.

The input station 114 is configured to receive at least one or more carriers 118 containing a plurality of IC packages 126 for testing within the IC package testing system 100. For example, the input station 114 may include a support surface 128 adapted to hold the carrier 118 (and/or other IC package carriers) in a position suitable for picking and placing (i.e., transfer) of the IC packages 126 from the carrier 118 by the robot 150.

The IC package testing system 100 may also include a precisor 142. The precisor 142 aligns and/or conditions the solder bumps on the bottom of the IC package 126 so that the IC package 126 is not damaged when interfaced with the test stations 130 of the testing system 100 or when interfaced with a printed circuit board. In one example, the robot 150 transfers the IC packages 126 from the input station 114 to the precisor 142 for conditioning of the solder bumps prior to transferring the IC packages 126 to the test stations of the testing system 100.

As discussed above, that test station 130 is disposed in the interior region 104 of the enclosure 102. In the example depicted in FIG. 2, two test stations 130 are shown. However, it is contemplated that any number of test stations 130 may be utilized as long as there is room within the enclosure 102, and that the robot 150 may access all of the test stations.

The test station 130 include an interface 134 configured to receive and communicatively connect with at least one IC package 126 in a manner that enables testing to be performed on the IC package 126. The interface 134 may include one or more chip sockets, daughter boards, probers or other electrical interface suitable for establishing communication between the IC package 126 and the testing circuitry of the test station 130.

The interface 134 may be configured to accept a single IC package 126 or multiple IC packages 126. The interface 134 may be readily removed and replaced on the test station 130 with another interface configured to interface with a different number and/or type of IC packages 126. Thus, the ability to swap the interface 134 with other interfaces allows the test station 130 to be readily adapted to meet production needs with minimal cost and down time.

The test station 130 may optionally include a test processor 138 if the testing is not controlled by the controller 170. The test processor 138 communicates with the controller 170 and generally includes a central processing unit (CPU), memory, and support circuits utilized to control the operation of the test station 130. The CPU may be any form of general purpose computer processor that may be used in an industrial setting. A software routine or a series of program instructions are stored in the memory, such as random access memory, read only memory, floppy, or hard disk drive, or other form of digital storage. The support circuit is conventionally coupled to the CPU and may include cache, clock circuits, input/output systems, power supplies, and the like. The test processor 138 is coupled to the IC package 126 connected to the interface 134 of the test station 130 when performing a test routine on the circuits of the IC package 126. When the test processor 138 is not present, the controller 170 is coupled to the IC package 126 through to the interface 134 of the test station 130 and functions as the as the test processor 138 is described below.

The test routine (e.g., predetermined test routine) is stored or accessible by the test processor 138. The test routine may be inputted into the test processor 138 through a user interface, or uploaded or accessed from the controller 170 and/or a host processing system. The test processor 138 executes the test routine in a manner that runs a predefined test on the one or more IC packages 126 coupled to the interface 134 of the test station 130. The test routine may be one or more of a DC test routine, a burn-in routine, post burn-in routine, a final test routine or other predefined test routine to be performed on the IC package 126.

In one example, a DC test routine is performed on IC package 126 disposed in the test station 130. The DC test routine may include subjecting the IC package 126 to a high DC load for a period to time, and testing the IC package 126 a short, resistance, temperature rise, RC delay, speed, other performance characteristic or malfunction or other defect.

In another example, a burn-in test routine is performed on IC package 126 disposed in the test station 130. The burn-in test routine may include subjecting the IC package 126 to a high-stress environment, such as high voltage, high amperage, high temperature and/or high frequency electric signals. The burn-in test routine may include subjecting the IC package 126 to a high-stress environment for a period to time, and testing the IC package 126 a short, resistance, temperature rise, RC delay, speed, other performance characteristic or malfunction or other defect.

In yet another example, a post burn-in test routine is performed on IC package 126 disposed in the test station 130. The post burn-in test routine may include testing the electrical characteristics and function of the IC package 126 at room temperature and below room temperature. The post burn-in test routine may include subjecting the IC package 126 to a room temperature environment for a period to time, and testing the electrical characteristics and function of the IC package 126. The post burn-in test routine may also include subjecting the IC package 126 to a sub-room temperature environment for a period to time, and testing the electrical characteristics and function of the IC package 126.

In still yet another example, a final test routine is performed on IC package 126 disposed in the test station 130. The final test routine may include testing the electrical characteristics and function of the IC package 126 at a temperature elevated above room temperature (e.g., elevated temperature). The final test routine may include subjecting the IC package 126 to an elevated temperature environment for a period to time, and testing the electrical characteristics and function of the IC package 126. In yet another example, the final test routine performed on IC package 126 may mimic operating conditions of the device in which the IC package 126 will be interfaced with. The operating conditions of the final test routine may include temperature variation and voltage fluctuations. It is contemplated that other test routines may be performed in the test station 130 or other test station within the testing system 100.

As discussed above, the robot 150 is disposed in the disposed in the interior region 104 and has a range of motion operable to transfer an IC package 126 between any of the input, output and test stations 114, 116, 130. In one example, the robot 150 includes a robot base 152, a robot linkage 154, a robot wrist 156, and at least one robot end effector 158. The robot base 152 may be centrally located within the enclosure 102. The robot linkage 154 is coupled at a proximal end to the robot base 152. Motors within the robot base 152 are operable to rotate the robot linkage 154 up to 360 degrees around the robot base 152.

The robot wrist 156 is coupled to a distal end of the robot linkage 154. The at least one robot end effector 158 is coupled to robot wrist 156. The robot end effector 158 is generally configured to facilitate picking and placing of the IC packages 126 by the robot 150 between the various stations of the testing system 100.

The robot linkage 154 is configured to extend and retract the robot end effector 158 and the robot wrist 156 radially relative to the robot base 152. The robot linkage 154 may also be configured to control the elevation of the robot end effector 158 within the enclosure 102. Alternatively, the robot base 152 may include actuators configured to control the elevation of the robot linkage 154 and robot end effector 158 coupled thereto.

The robot wrist 156 also allows the robot end effector 158 to be rotated relative to the robot linkage 154. The rotation of the robot wrist 156 and motion of the robot linkage 154 allows the robot end effector 158 to be orientated in a manner, for example in an orientation normal to the support surface 128 of the carriers, that allows a selected one of the IC packages 126 to be picked up from or placed on any one of the stations 114, 116, 130.

The robot end effector 158 is generally configured to selectively secure the IC package 126 to the robot 150 during transfer between the carrier 118 disposed in the input station 114 and the test station 130. In other words, the robot end effector 158 enables the picking and placing of the IC packages 126 between any one of the stations 114, 116, 130 by the robot end effector 158.

Figure 2:
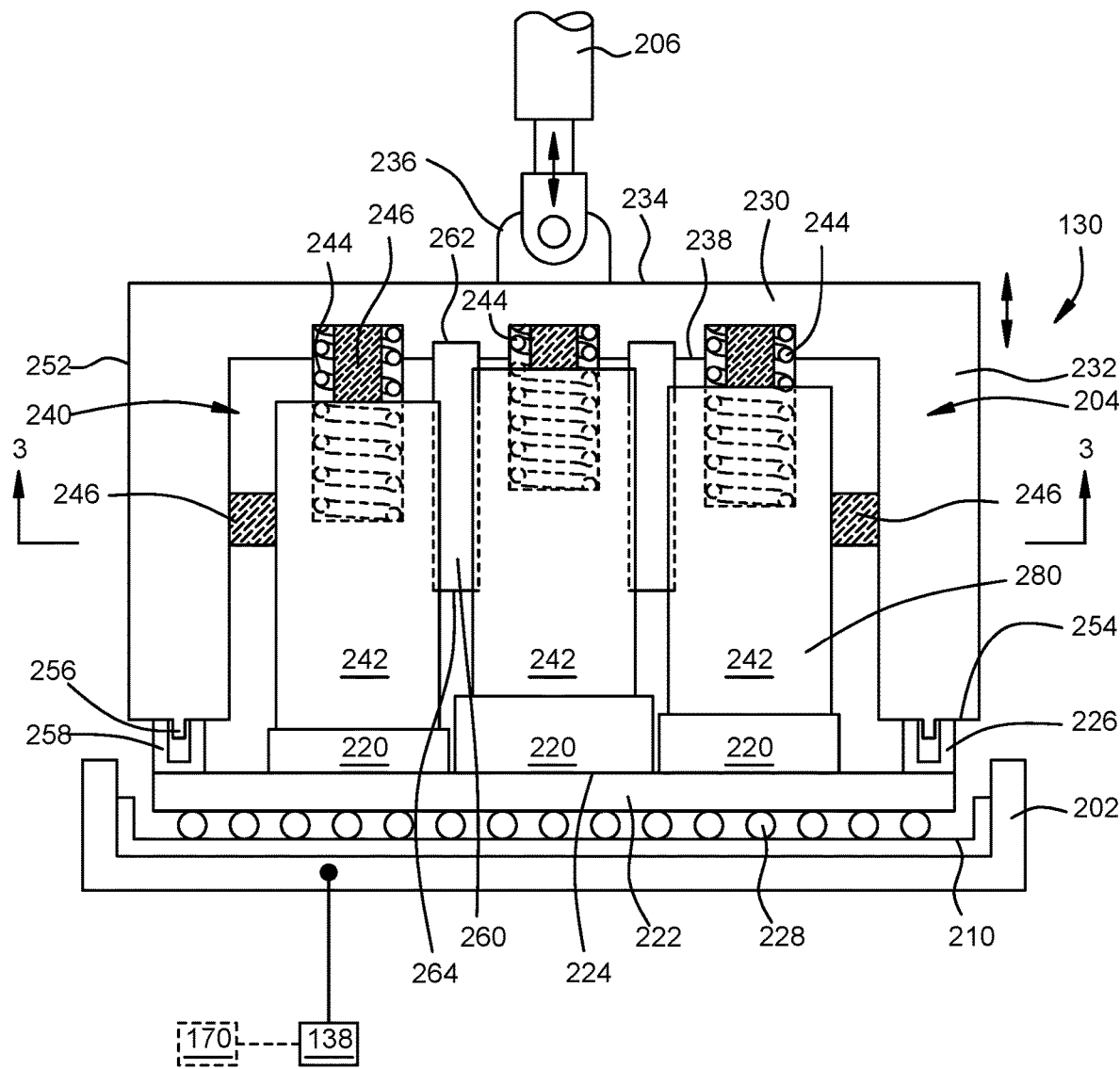
FIG. 2 is a schematic side view of a test station of the IC package testing system of FIG. 1.

FIG. 2 is a schematic side view of the test station 130 of the IC package testing system 100 of FIG. 1. As described above, the IC packages 126 tested in the test station 130 each include at least two or more integrated circuit (IC) dice 220 disposed on a substrate 222. The substrate 222 may be a package substrate or an interposer mounted to a package substrate. Tops 224 of the dice 220 are often at different heights from a bottom 226 of the substrate 222. The bottom 226 of the substrate 222 includes a plurality of micro-bumps 228 which electrically couple to the circuitry of the dice 220 through electrical routing formed though the substrate 222.

The test station 130 includes a test fixture base 202, a test fixture head 204 and a test fixture actuator 206. The test fixture base 202 that includes the interface 134. The head 204 may be coupled to the base 202 via a hinge or be otherwise positionable over the base 202, for example, through use of a gantry-style positioning device or linear actuator. The head 204 is movable between a (first) position clear of the base 202 that allows the IC package 126 to be placed in and retrieved from the interface 134, and a (second) position that contacts the tops 224 of the dice 220 of the IC package 126 so that the actuator 206 may applied a force to the IC package 126 that ensures sufficient electrical connection between a chip socket 210 of the interface 134 and micro-bumps 228 formed on the bottom 226 of the substrate 222. The chip socket 210 suitable for establishing communication between the IC package 126 and the testing circuitry of the test station 130. The chip socket 210 is connected to the test processor 138 so that the test processor 138 may run the predefined test routine on the IC package 126 disposed in the socket 210 of the interface 134 of the test station 130.

The head 204 includes a base plate 230 and sidewalls 232. The base plate 230 and sidewalls 232 may be fabricated from a material having high thermal conductivity, such as aluminum and copper, among other materials, to promote heat dissipation from the dice 220 while under test.

A top 234 of the base plate 230 has a mounting structure 236 configured for coupling to the actuator 206. A bottom 238 of the base plate 230 and the sidewalls 232 bound a recess 240. The actuator 206 may be a pneumatic cylinder, a hydraulic cylinder, a solenoid, a linear actuator or other motion device suitable for positioning the head 204 and applying force to the IC package 126. The actuator 206 may be controlled by one of the test processor 138 or the controller 170.

A top 252 of the sidewalls 232 is coupled to the bottom 238 of the base plate 230. A bottom 254 of the sidewalls 232 is disposed opposite the top 252 is spaced away from the bottom 238 of the base plate 230. The bottom 254 of the sidewalls 232 may include an engagement feature 256 configured to engage with a mating complimentary engagement feature 258 disposed on the substrate 222. In the embodiment depicted in FIG. 2, the engagement feature 256 of the sidewall 232 is a protrusion, such as a ridge or post, extending from the bottom 254 that interleaves or extends into the complimentary engagement feature 258, such as a groove or slot, formed in a stiffener 226 disposed on the substrate 222.

An array of independently movable pushers 242 are disposed in the recess 240. Advantageously, the independently movable pushers 242 provide a conformable die contacting surface for test fixture head 204 that accommodates different die heights, as shown in FIG. 2, thereby substantially preventing application of unwanted and potentially damaging excess force to dies 220 of a package having greater heights as compared to neighboring dies 220. Each of the independently movable pushers 242 has a respective force generating member 244 disposed between the pushers 242 and the bottom 238 of the base plate 230. The force generating member 244 may be a resilient material, such as an elastomer, a coil spring, a flat spring, a pneumatic cylinder, a hydraulic cylinder, a solenoid, a motorized actuator or other device or structure that is suitable for urging the pushers 242 away from the bottom 238 of the base plate 230. In the embodiment depicted in FIG. 2, the force generating member 244 are coil springs. The pushers 242 may also include a locating feature for retaining and/or guiding the force generating member 244, for example, the pushers 242 may include a locating feature in the form of a blind hole that accepts a force generating member 244 that is in the form of a coil spring. In one embodiment, the sidewalls 232 bounding the interior recess 240 of the test fixture head 204 in which the plurality of pushers 242 are disposed extend farther from the base plate 230 relative to the pushers 242 so that the pushers 242 are protected when not in use.

The pushers 242 and the force generating members 244 may be fabricated from a material having high thermal conductivity, such as aluminum and copper, among other materials. The thermally conductive pushers 242 and force generating members 244 advantageously promote heat transfer from the die 220 to the head 204.

Optionally, a thermal interface material (TIM) 246 may also be disposed between the pusher 242 and the base plate 230 of the head 204. The TIM 246 may be selected to provide a thermally conductive path between the IC die 220 and the head 204 so that heat generated by the IC die 220 may be dissipated through the head 204 during testing.

The TIM 246 is generally a heat transfer material having a conductivity of at least about 0.3 W/m·K. Examples of materials suitable for use the TIM 246 includes thermal grease, thermally conductive epoxy, phase change materials, conductive tapes, and silicone-coated fabrics among other suitable materials. The TIM 246 may be a soft or compliant adhesive to allow compensation between mismatched heights of IC die 220 and a bottom contact surface 248 of the pusher 242.

TIM 246 may also be disposed between the pushers 242 and the sidewalls 232 of the head 204. The TIM 246 between the pushers 242 and the sidewalls 232 provides two advantages. First, the TIM 246 functions as a lubricant between the pushers 242 and the sidewalls 232 so that the pushers 242 move freely. Additionally, the TIM 246 enhances the thermally conductive path between the IC die 220 and the head 204 so that heat generated by the IC die 220 is dissipated more efficiently through the head 204 during testing.

A plurality of guides 260 may be disposed between the pushers 242. A first end 262 of the guides 260 is coupled to or extends into the bottom 238 of the base plate 230, while a distal end 264 extends between the pushers 242. The distal end 264 is recessed from a bottom surface 280 of the pushers 242 by a distance sufficient to allow the pushers 242 to travel towards the bottom 238 of the base plate 230 upon contact with the dice 220 without the guides 260 contacting the dice 220. The length of the sidewalls 232 of the head 204 is generally selected to allow a predetermined amount of force to be generated by the pushers 242 due to compression of the force generating member 244 without damaging the IC package 126 due to excessive application of force.

The guides 260 may also be fabricated from a material having high thermal conductivity, such as aluminum and copper, among other materials, to enhance heat transfer between the pushers 242 and the head 204, thereby more efficiently removing heat from the die 220 while under test. The material comprising or coating the guides 260 may also be selected from a material that enhances movement of the pushers 242 freely between the guides 260 without galling or excessive friction.

Figure 3:
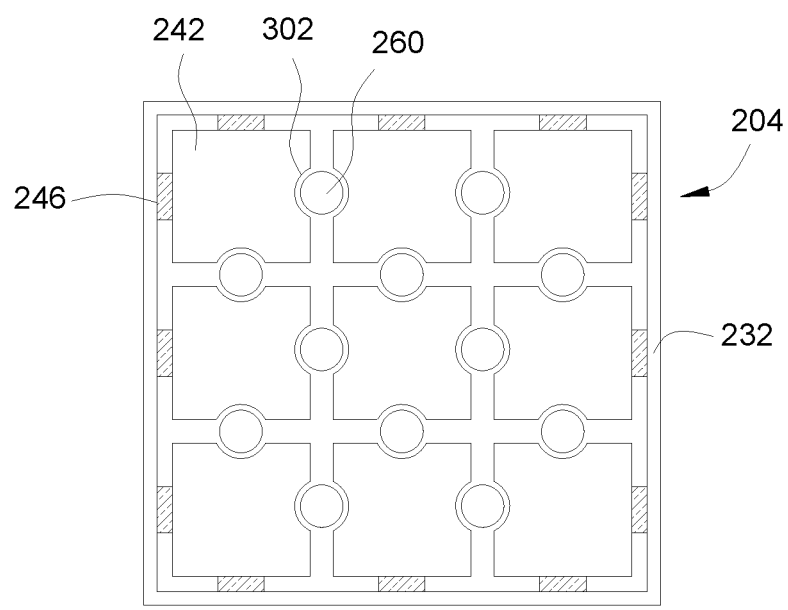
FIG. 3 is a schematic sectional view of a portion of the test station of FIG. 2.

FIG. 3 is a schematic sectional view of a portion of the test station 130 of FIG. 2 taken horizontally through the guides 260 and the pushers 242. The guides 260 may have a geometry that nests between or interleaves with the pushers 242 to promote linear movement of the pushers 242 in a direction substantially perpendicular to the test fixture base 202 and the bottom 238 of the base plate 230. In the example depicted in FIG. 3, the guides 260 have a substantially cross section, such as a round cross section, that extends partially into recesses 302 having a complimentary geometry, for example a curved recess, formed in a sidewall 504 of the pushers 242. It is contemplated that the guides 260 may have other cross sectional shapes that mate with complimentary recesses 302 formed in facing sidewalls 504 of adjacent pushers 242. It is also contemplated that the guides 260 may mate with complimentary recesses 302 formed in the corners of adjacent pushers 242. Additionally, or as an alternative, adjacent pushers 242 interleave or have mating features that promote self-alignment and independent movement among the pushers 242.

In the example depicted in FIG. 3, the array of independently movable pushers 242 is shown arranged in a Cartesian grid (i.e., a grid of X rows and Y columns). In some embodiments, each die 220 of the IC package 126 is engaged by a single and separate (i.e., respectively different) pusher 242 of the plurality of pushers 242. In other embodiments, multiple pushers 242 are configured to engage a single die 220 of the IC package 126. In yet other embodiments, the array of independently movable pushers 242 may be arranged in a polar array, or other geometric or random configuration. Although the head 204 may be configured to be used for a specific arrangement of dice 220, the array can also be utilized with other die arrangements without having to change the configuration of the pushers 242. It is also contemplated that the head 204 may be exchanged with another head to accommodate other die configurations.

Referring back to FIG. 2, in operation, the IC package 126 is disposed in the socket 210 of the test station 130 by the robot 150 while the head 204 is in a clear (first) position. The head 204 is moved into contact with IC package 126 and the actuator 206 applies a force so that the sidewalls contact the substrate 222 of the IC package 126. With the head 204 now in a test (second) position with the IC package 126 in contact with the pushers 242, the pushers 242 may be displaced independently relative to each other as needed to conform and accommodate differences in die height. In comparison, conventional test fixture heads having rigid and non-confirming die contact surfaces generally apply force unevenly between dies of different heights, thereby applying excess stress to the dies and package which often leads to damage.

For example in FIG. 2, the die 220 disposed in the center of the IC package 126 has a height greater than the adjacent dice 220, with the die 220 to the right of the center die 220 having a height greater than the die 220 to the left of the center die 220. Thus, the pusher 242 contacting the die 220 to the right of the center die 220 will be displaced independently and less than the pusher 242 contacting the die 220 to the left of the center die 220, while the pusher 242 contacting the die 220 to the left of the center die 220 will be displaced independently and less than the pusher 242 contacting the center die 220. The ability of each pusher 242 to be displaced independently of a pusher contacting a different die 220 allows the force to be applied primarily to the substrate 222 through the sidewalls 232 rather than through the dice 220, thereby substantially preventing high loading directly over individual dies which can cause damage to the package 126, for example, by cracking the substrate 222 and/or damaging the die-to-substrate solder connections, which can occur when using conventional test fixture heads having rigid and non-confirming die contact surfaces.

Figure 4:
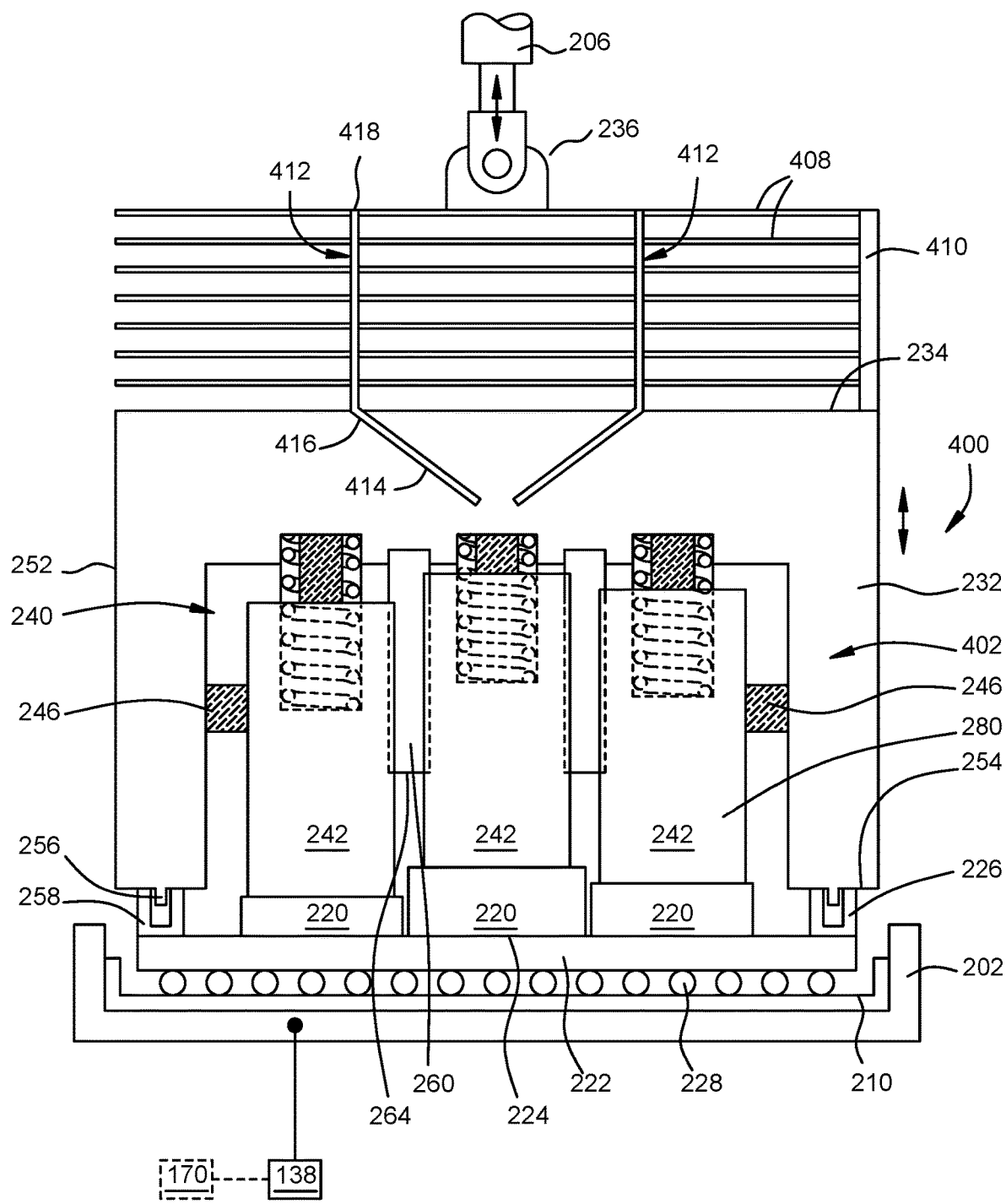
FIG. 4 is a schematic side view of another test station of an IC package testing system.

FIG. 4 is a schematic side view of another test station 400 of an IC package testing system, such as the IC package testing system 100 or other suitable testing system. The test station 400 is configured essentially identical to the test station 130 described above, except in that a head 402 of the test station 400 include one or more enhanced heat transfer features.

More specifically, the head 402 of the test station 400 is configured essentially identical to the head 204 described above, except in that the head 402 of the test station 400 includes the one or more enhanced heat transfer features interfaced with the top 234 of a base plate 230 of the head 402. The heat transfer features function to more efficiently dissipate heat from the head 402, thereby allowing more efficient cooling of the dice 220 tested in the test station 400.

In one example, a heat transfer feature may be in the form of a plurality of fins 408 formed on the top 234 of the head 402. The fins 408 may be have an orientation perpendicular to the top 234 of the head 402, have another orientation, or as in the embodiment depicted in FIG. 4, have an orientation parallel to the top 234 of the head 402. When in an orientation parallel to the top 234 of the head 402, the fins 408 may extend from a common wall 410 extending perpendicular from the top 234 of the head 402, or alternatively, the fins 408 may be separated from the top 234 and each other by thermally conductive standoffs.

In another example, a heat transfer feature may be in the form of one or more heat pipes 412. The heat pipe 412 includes a sealed pipe or tube made of a material that is compatible with a working fluid such as copper for water heat pipes, or aluminum for ammonia heat pipes. Each heat pipe 412 has a first end 414 that is in good physical and thermal contact with the top 234 of the head 402. For example, the first end 414 of the heat pipe 412 may be brazed or soldered into a hole 416 formed in the top 234 of the head 402. A distal end 418 of the heat pipe 412 may be in contact with a heat sink, such as the fins 408 or other heat sink. In the example depicted in FIG. 4, the distal end 418 of the heat pipe 412 is brazed or soldered to the fins 408. The working fluid within the heat pipe 412 turns into a vapor by absorbing heat from top 234 of the head 402. The vapor then travels inside the heat pipe 412 to the distal end 418, where the vapor condenses back into a liquid, thereby releasing latent heat. The working fluid then returns to the first end 414 through capillary action or gravity, and the cycle then repeats to further transfer heat from the dice 220 through the head 402 to the fins 408.

Figure 5:
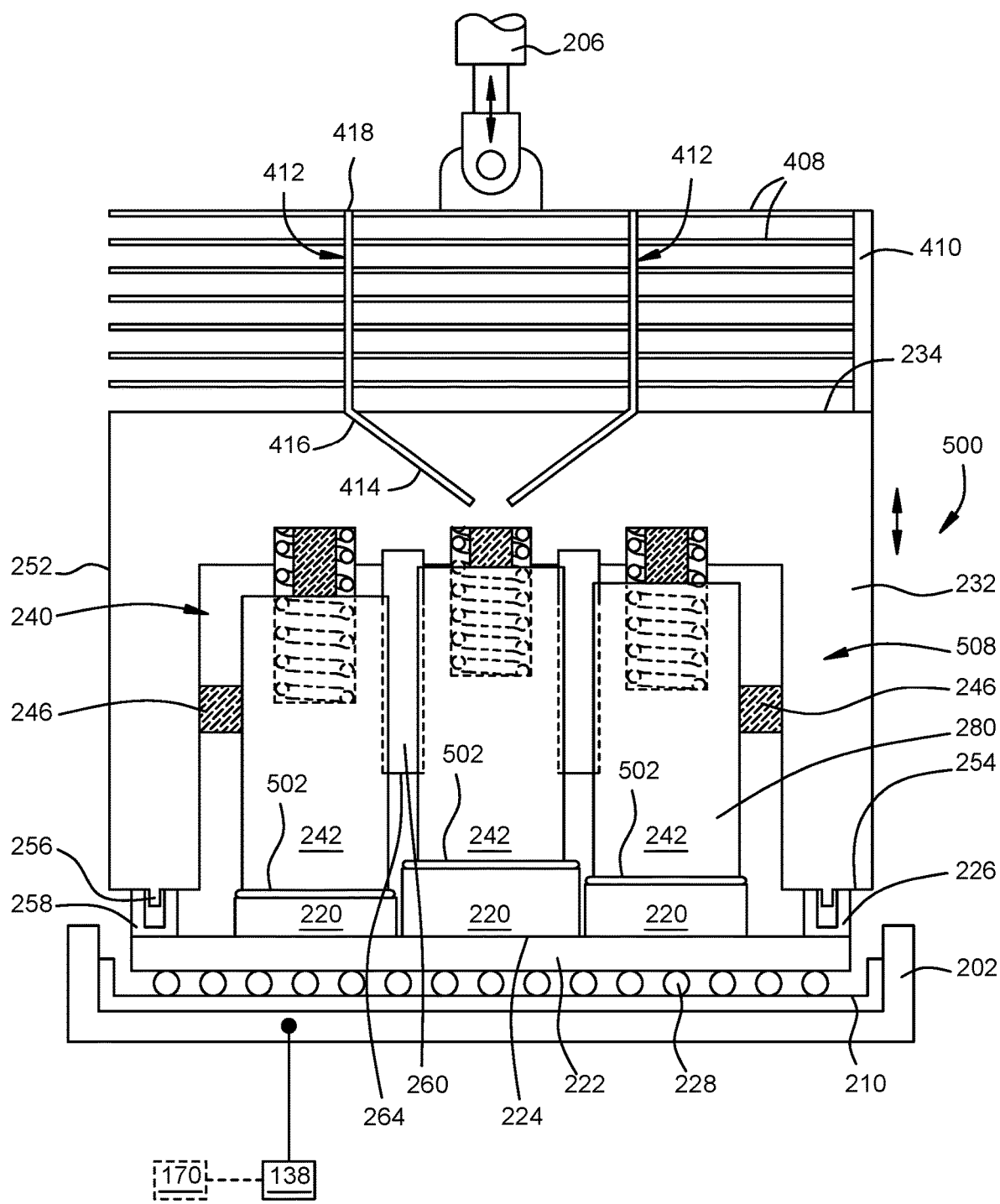
FIG. 5 is a schematic side view of another test station of an IC package testing system.

FIG. 5 is a schematic side view of another test station 500 of an IC package testing system, such as the IC package testing system 100 or other suitable testing system. The test station 500 is configured essentially identical to the test stations 400 described above, except in that a head 508 of the test station 500 includes discrete compliant TIM segments 502 disposed on the bottom surface 280 of at least one or more of the pushers 242. The compliant TIM segments 502 ensures good heat transfer between each pusher 242 and its associated die 220 particularly in situations where substrate warpage or tilting of the pushers 242 cause the bottom surface 280 and the top surfaces of the dice 220 not to be parallel relative to each other. Advantageously, the TIM segments 502 inhibit lateral heat transfer near adjacent dice 220 which may be beneficial in embodiments where heat from one die needs to be routed away from adjacent dice.

Additionally, the compliant TIM segments 502 may also be utilized with pushers 242 of the test station 130, or other suitable test station.

Figure 6:
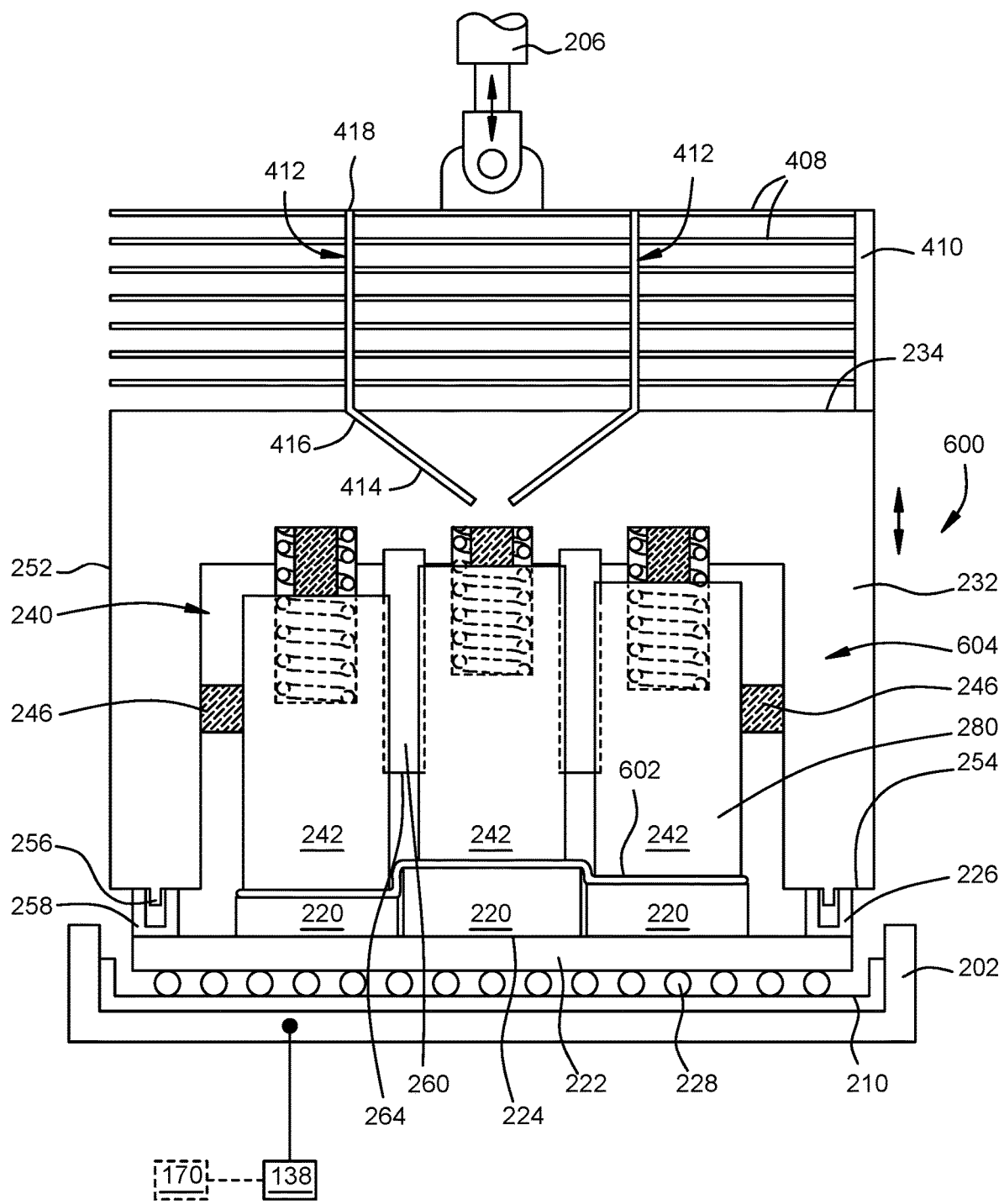
FIG. 6 is a schematic side view of yet another test station of an IC package testing system.

FIG. 6 is a schematic side view of yet another test station 600 of an IC package testing system, such as the IC package testing system 100 or other suitable testing system. The test station 600 is configured essentially identical to the test stations 500 described above, except in that a head 604 of the test station 600 includes a compliant thermally conductive sheet 602 disposed between the bottom surface 280 of two or more of the pushers 242 and the IC package 126. The compliant sheet 602 may be formed from a material, such as TIM or TIM disposed on a membrane, having good heat transfer properties that ensure good heat transfer between the pushers 242 and the dice 220. In example depicted in FIG. 6, a single compliant thermally conductive sheet 602 is disposed across the bottom surfaces 280 of all the pushers 242 of the head 604. The conductive sheet 602 may be coupled with a repositionable thermally conductive adhesive to the bottom surfaces 280 of the pushers 242. Advantageously, a single conductive sheet 602 promotes lateral heat transfer closer to the dice 220 which may be beneficial in embodiments where the dice are very spaced across the substrate 222.

Additionally, the compliant thermally conductive sheet 602 may also be utilized with pushers 242 of the test station 130, or other suitable test station.

Figure 7:
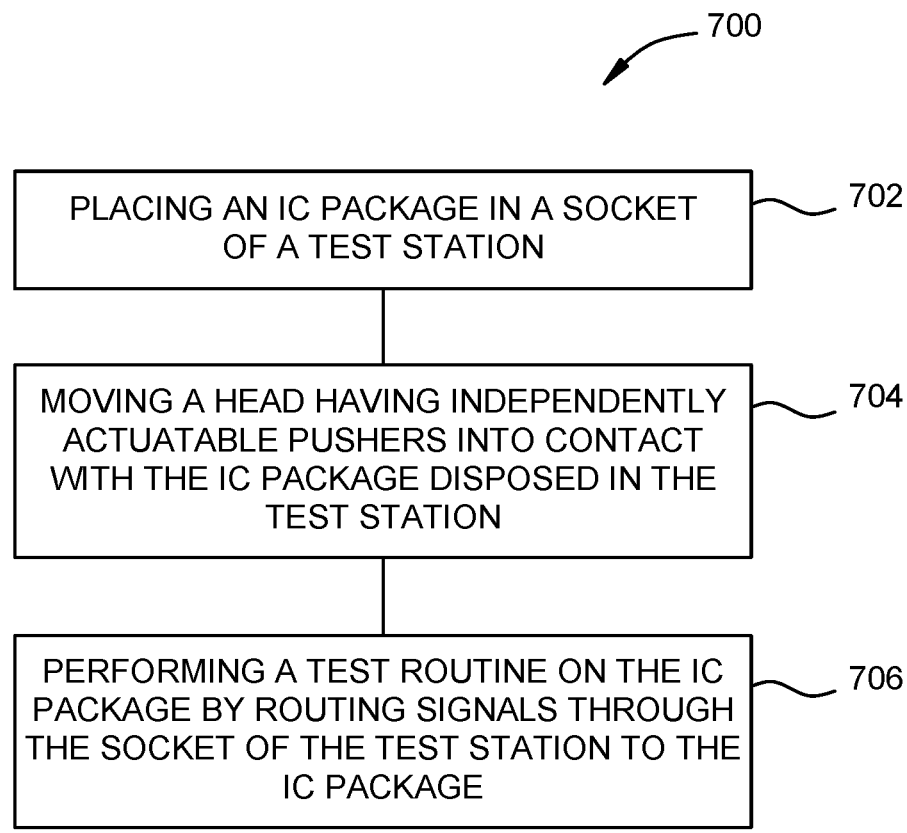
FIG. 7 is a flow diagram of a method for testing an IC package in an IC package testing system.

FIG. 7 is a flow diagram of a method 700 for testing an IC package 126 in an IC package testing system, such as any of the testing systems described above or other suitably adapted testing system. The method 700 begins at operation 702 by placing the IC package 126 in the socket 210 of a test station, such as any of the test stations described above, or other suitable test station. The IC package 126 may be placed in the socket 210 of the test station utilizing a robot. At operation 704, a head having independently actuatable pushers is moved into contact with the IC package 126. In one example, sidewalls of the head are placed in contact with the substrate of the IC package 126. In another example, one or more engagement features of the sidewalls of the head are engaged with one or more complimentary engagement features present on the substrate of the IC package 126, such as a protrusion of the sidewall mating with a complimentary feature, such as a slot or groove, formed in a stiffener disposed on the substrate of the IC package 126. During operation 704, pushers of the head individually and independently displace to accommodate different heights of dice disposed on the substrate of the IC package 126.

At operation 706, a test routine is performed on the IC package 126 by routing signals from a test processor through the socket 210 of the test station to the IC package 126. The test routine may be one or more of a DC test routine, a burn-in routine, post burn-in routine, a final test routine or other predefined test routine. After testing at operation 706, the head is moved clear of the IC package 126 to allow the IC package to be removed from the test station by the robot.

Thus, an IC package test system has been provided having confirming die contact surfaces which improve testing while applying different amounts of force to discreet locations of the IC package so that good electrical connection may be established between the IC package and the test system without adversely stressing the IC package. Furthermore, the force applicator of the IC package testing system is flexible in that it will accommodate IC packages having different geometric configurations, thereby enabling changing production demands to be met with limited additional capital expenditures or down time for system reconfiguration.

While the foregoing is directed to embodiments of the present invention, other and further embodiments of the invention may be devised without departing from the basic scope thereof, and the scope thereof is determined by the claims that follow.

What is claimed is:
1. An IC package testing system comprising:
   a test fixture base;
   a socket disposed on the test fixture base, the socket configured to receive an IC package for testing, the IC package including at least two dice disposed on a single substrate; and a test fixture head movable towards and away from the base, the test fixture head comprising:
a base plate; and
a plurality of independently movable pushers coupled to a bottom of the base plate, the plurality of pushers configured to respectively engage different dice of the IC package disposed in the socket.

2. The IC package testing system of claim 1, wherein each pusher is displaceable a distance independent of a distance displaced by an adjacent one of the pushers.

3. The IC package testing system of claim 1, wherein the plurality of pushers are fabricated from a material having high thermal conductivity.

4. The IC package testing system of claim 1, wherein the test fixture head further comprises:
a plurality of force generating members, each force generating member disposed between a respective one of the pushers and the base plate.

5. The IC package testing system of claim 4, wherein the plurality of force generating members comprise a resilient material, a coil spring, a flat spring, a pneumatic cylinder, a hydraulic cylinder, a solenoid, or a motorized actuator.

6. The IC package testing system of claim 5, wherein the plurality of pushers and the plurality of force generating members are fabricated from a material having high thermal conductivity.

7. The IC package testing system of claim 6, wherein the test fixture head further comprises:
a thermal interface material disposed between the plurality of pushers and the base plate.

8. The IC package testing system of claim 1, wherein the test fixture head further comprises:
sidewalls bounding an interior recess of the test fixture head in which the plurality of pushers are disposed, the sidewalls extending farther from the base plate relative to the pushers.

9. The IC package testing system of claim 1, wherein the test fixture head further comprises:
a plurality of guides coupled to the base plate and disposed between the plurality of pushers.

10. The IC package testing system of claim 1, wherein the test fixture head further comprises:
a plurality of fins coupled to a top of the test fixture head.

11. The IC package testing system of claim 1, wherein the test fixture head further comprises:
a heat pipe coupled to a top of the test fixture head.

12. The IC package testing system of claim 1, wherein the test fixture head further comprises:
a plurality of fins and a heat pipe coupled to a top of the test fixture head.

13. The IC package testing system of claim 1, wherein the test fixture head further comprises:
TIM segments disposed on two or more of the plurality of pushers.

14. The IC package testing system of claim 1, wherein the test fixture head further comprises:
a TIM sheet disposed across the plurality of pushers.

15. An IC package testing system comprising:
a test fixture base;
a socket disposed on the test fixture base, the socket configured to receive an IC package for testing, the IC package including at least two dice disposed on a single substrate; and
a test fixture head movable towards and away from the base, the test fixture head comprising:
a base plate;
sidewalls extending from the base plate;
a plurality of independently movable pushers coupled to a bottom of the base plate and surrounded by the sidewalls, the plurality of pushers configured to respectively engage different dice of the IC package;
a plurality of force generating members, each force generating member disposed between a respective one of the pushers and the base plate, the plurality of pushers and the plurality of force generating members fabricated from a material having high thermal conductivity; and
a plurality of guides coupled to the base plate and disposed between the plurality of pushers.

16. The IC package testing system of claim 15, wherein the test fixture head further comprises:
a plurality of fins and a heat pipe coupled to a top of the test fixture head.

17. The IC package testing system of claim 1, wherein the test fixture head further comprises:
TIM segments disposed on two or more of the plurality of pushers; or
a TIM sheet disposed across the plurality of pushers.

18. A method for testing an IC package, the method comprising:
disposing an IC package in a socket of an IC package test station, the IC package including at least two dice disposed on a single substrate;
respectively engaging two or more dice, each at a discreet location, of the IC package with independently movable pushers while urging the IC package into electric connection with the socket; and
performing a test routine on the IC package disposed in the IC package test station.

19. The method of claim 18 further comprising:
drawing heat away from the two or more dice of the IC package through the pushers to one or more of a heat pipe and fins.

20. The method of claim 18 further comprising:
engaging a substrate of the IC package to clamp the IC package in the socket while a first pusher of the pushers is displaced by a first die of the two or more dice an amount different than an amount a second pusher of the pushers is displaced by a second die of the two or more dice.

* * * * *